United States Patent [19]
Lee et al.

[11] Patent Number: 5,349,235
[45] Date of Patent: Sep. 20, 1994

[54] HIGH DENSITY VERTICALLY MOUNTED SEMICONDUCTOR PACKAGE

[75] Inventors: Joon K. Lee, Seoul; Hyeon J. Jeong, Inchon; Kyung S. Kim; Oh-Sik Kwon, both of Seoul, all of Rep. of Korea

[73] Assignee: Samsung Electronics Co., Ltd., Kyungki-do

[21] Appl. No.: 111,518

[22] Filed: Aug. 25, 1993

[30] Foreign Application Priority Data

Sep. 8, 1992 [KR] Rep. of Korea ............... 92-16337

[51] Int. Cl.$^5$ ............................................. H01L 23/16
[52] U.S. Cl. .................................... 257/693; 257/730; 257/723; 361/772; 365/52
[58] Field of Search ............... 257/693, 696, 697, 685, 257/686, 730, 723, 724; 361/772, 785, 791; 365/52

[56] References Cited

U.S. PATENT DOCUMENTS

| | | | |
|---|---|---|---|
| 4,266,282 | 5/1981 | Henle et al. | 365/52 |
| 4,855,809 | 8/1989 | Malhi et al. | 357/75 |
| 4,967,262 | 10/1990 | Farnsworth | 257/696 |
| 4,975,763 | 12/1990 | Baudouin et al. | 357/74 |
| 5,031,072 | 7/1991 | Malhi et al. | 257/723 |
| 5,260,601 | 11/1993 | Baudouin et al. | 257/696 |

FOREIGN PATENT DOCUMENTS

| | | | |
|---|---|---|---|
| 2125648 | 5/1990 | Japan | 257/730 |
| 3129866 | 6/1991 | Japan | 257/724 |

*Primary Examiner*—William Mintel
*Assistant Examiner*—Roy Potter
*Attorney, Agent, or Firm*—Cushman, Darby & Cushman

[57] ABSTRACT

A semiconductor chip package comprises leads which protrude from one side of a package body, and support portions which are formed at both ends of the package body on either side of the leads for firmly mounting the package on a printed circuit board (PCB). The support portions are made of a same material as the package body. At the package body, a slot is formed to further protect the leads, and the leads are alternately formed to mount the packages close by. Thus, there is no additional process step for forming holes in the PCB to mount the support portions of the semiconductor package, so the mounting process of the package becomes simpler. The support portions which protrude from the package body permit the package to be mounted on the PCB firmly. The slot and support portions protect the leads and prevent the leads from being deformed by external forces, thereby improving the reliability of the semiconductor package. Also, since the leads are alternately formed and the packages can be mounted near to each other, the package occupies only a small area of the PCB, thereby improving the packing density.

8 Claims, 3 Drawing Sheets

HIGH DENSITY VERTICALLY MOUNTED SEMICONDUCTOR PACKAGE

BACKGROUND OF THE INVENTION

The present invention relates to semiconductor packages and, more particularly to, a vertical surface mounted semiconductor package which is firmly mounted vertically on a printed circuit board (PCB) by forming a protrusion on its body.

Recently, according to the trends toward higher density, higher capacity, faster signal processing speed, increasing power consumption, multi-function, and higher packing density, the importance of semiconductor chip package design is growing. Along with higher density and higher capacity of semiconductor chips and memory devices, the number of input and output pin leads is increased, so a fine pitch between the leads is required. Also, in order to dissipate a large amount of heat generated in the semiconductor chip according to the increase of operating speed and power consumption, an additional heat sink is required in the semiconductor package or the package body must be made of materials having a high thermal conductivity. With the multi-function of the semiconductor chip, semiconductor packages with a variety of functions are required. In addition, according to demands for high-density mounting of the semiconductor chips, investigation of stacked mounting of the semiconductor packages or direct mounting of the semiconductor chips into the PCB is proceeding.

In general, semiconductor chips (e.g., IC and LSI) are sealed in packages and mounted on the PCB. In the case of a standard semiconductor chip package, the semiconductor chip is loaded on a metal die pad for heat sink purposes. Then the electrode pads on the semiconductor chip are connected with leads for connection with external circuits by bonding wires. A package body made of epoxy molding compound (EMC) is formed to protect the semiconductor chip and the bonding wires. A dual in line package (DIP) type in which the leads extend from opposing sides of the package and a quad flat package (QFP) type in which the leads extend from all four peripheral sides of the package are very common. Since the QFP can form more lead connections than the DIP, it enhances the mounting density on the PCB.

In order to further enhance the mounting density of the chip packages, a vertical package (VPAK) and a vertical surface mounted package (VSMP) that occupy a small area due to vertical mounting on the PCB are being investigated.

FIGS. 1 and 2 show a conventional VPAK 10.

A plurality of leads 14 which are connected to the PCB (not shown) protrude from one side of a rectangular package body 12 in which a semiconductor chip (not shown) is mounted. The leads 14 are all aligned in the same direction. Also, support portions 16 protrude at both ends of the side of the package body 12 from which the leads 14 protrude. The support portions 16 are formed of EMC like the package body 12 and extend from the package body 12 farther than the leads 14. Also, the support portions 16 each have a hanging jaw 18 in a middle part to protect the bent leads 14.

As shown in FIG. 10, the ends of the support portions 16 are inserted into holes 42 formed on the PCB so that the VPAK 10 is firmly supported. The hanging jaw 18 is adhered onto an upper part of the hole 42 to thereby prevent the leads 14 from being deformed.

FIGS. 3 to 5 show a conventional VSMP 20. A plurality of leads 24 which are electrically connected to the PCB (not shown) protrude from one side of a rectangular package body 22 on which the semiconductor chip (not shown) is mounted. The leads 24 are bent in the same direction. A pair of support portions 26 are formed at both ends of the side of the package body 22 having leads 24 extending therefrom and are bent in both directions to support the package body 22. The support portions 26 are made of metal, are longer than the leads 24, and are aligned with the leads 24. The VSMP 20 is adhered on the PCB 40 by soldering so it is firmly supported, thereby preventing the leads 24 from being deformed due to external force.

In the conventional VPAK 10, however, the mounting process is complicated since the holes 42 into which the support portions 16 are inserted must be formed separately to mount the VPAK 10 on the PCB 40. Also, in the VSMP 20, the leads 24 are susceptible to deformation when a thin lead frame is used.

SUMMARY OF THE INVENTION

An object of the present invention is to provide a semiconductor package which is simple to mount on the PCB from a manufacturing standpoint.

Another object of the invention is to provide a semiconductor package which protects the leads from being deformed even when a thin lead frame is used.

According to the present invention, a semiconductor chip package is provided with a package body for protecting a semiconductor chip mounted therein, and leads protruding from one side of the package body. The semiconductor chip package also has support portions, typically formed of the same material as the package body, formed in a predetermined shape and disposed at the ends of the side of the chip package having the leads extending therefrom. The semiconductor chip package also has a slot portion formed to protect the leads from being damaged.

DETAILED DESCRIPTION OF THE INVENTION

An embodiment of the present invention will now be described in more detail with reference to accompanying drawings.

FIGS. 6 to 9 show various views of a semiconductor chip package according to the present invention.

Figure 1:
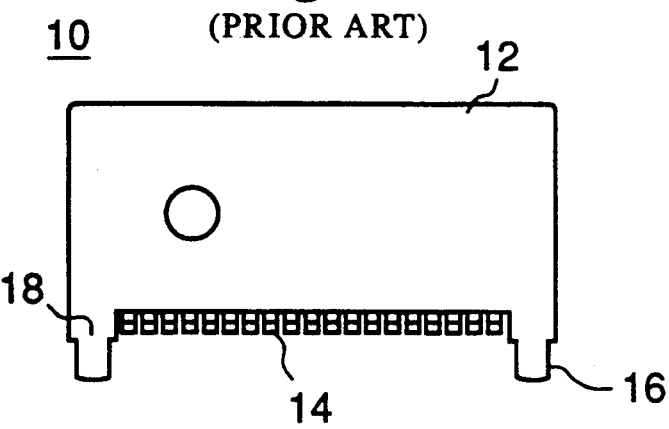
FIG. 1 is a front view of a conventional vertical package.
Figure 2:
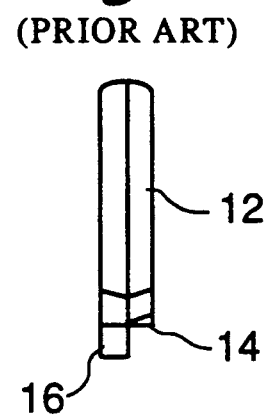
FIG. 2 is a side view of the conventional vertical package in FIG. 1.
Figure 3:
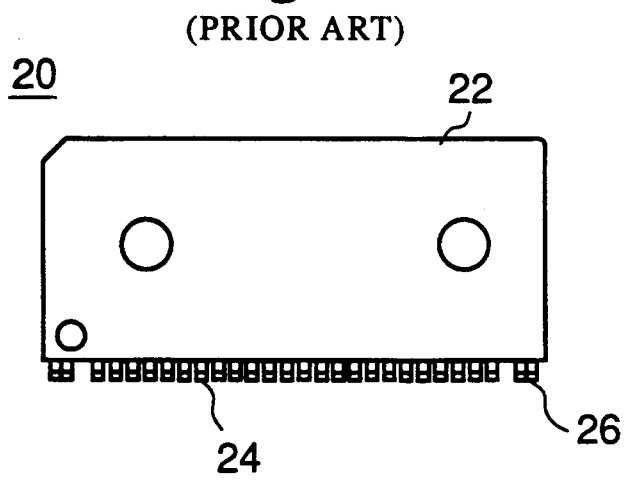
FIG. 3 is a front view of a conventional vertical surface mounted package.
Figure 4:
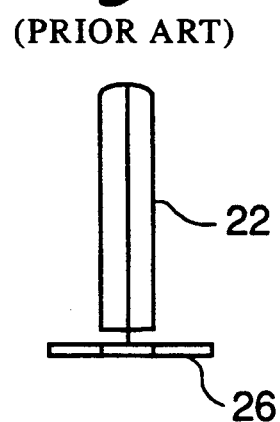
FIG. 4 is a side view of the conventional vertical surface mounted package in FIG. 3.
Figure 5:
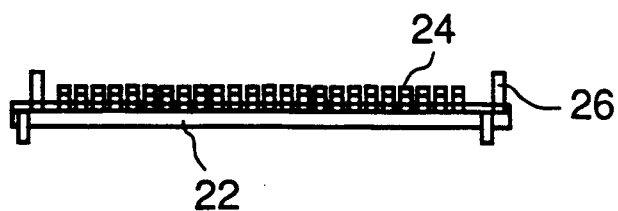
FIG. 5 is a plan view of a conventional vertical surface mounted package.
Figure 6:
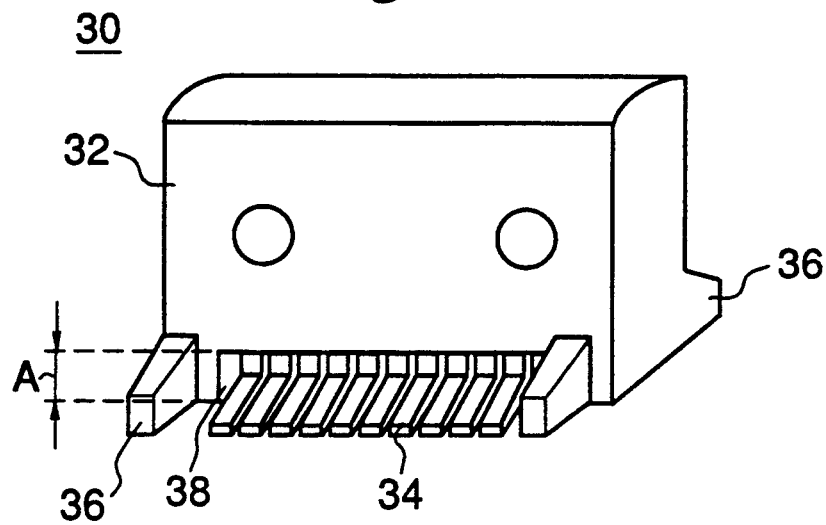
FIG. 6 is a perspective view of a semiconductor chip package according to the present invention.
Figure 7:
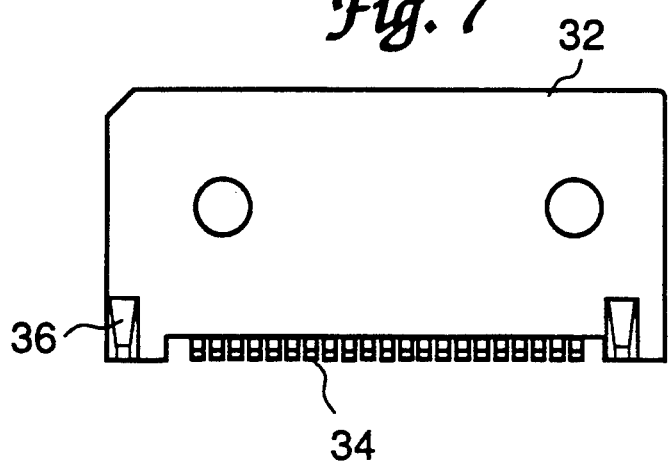
FIG. 7 is a front view of a package according to the present invention.
Figure 8:
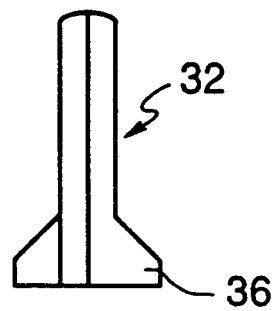
FIG. 8 is a side view of a package according to the present invention.
Figure 9:
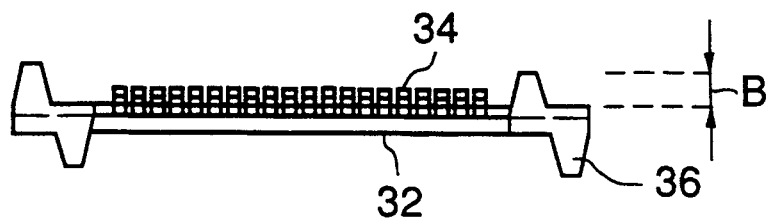
FIG. 9 is a plan view of a package according to the present invention.
Figure 11:
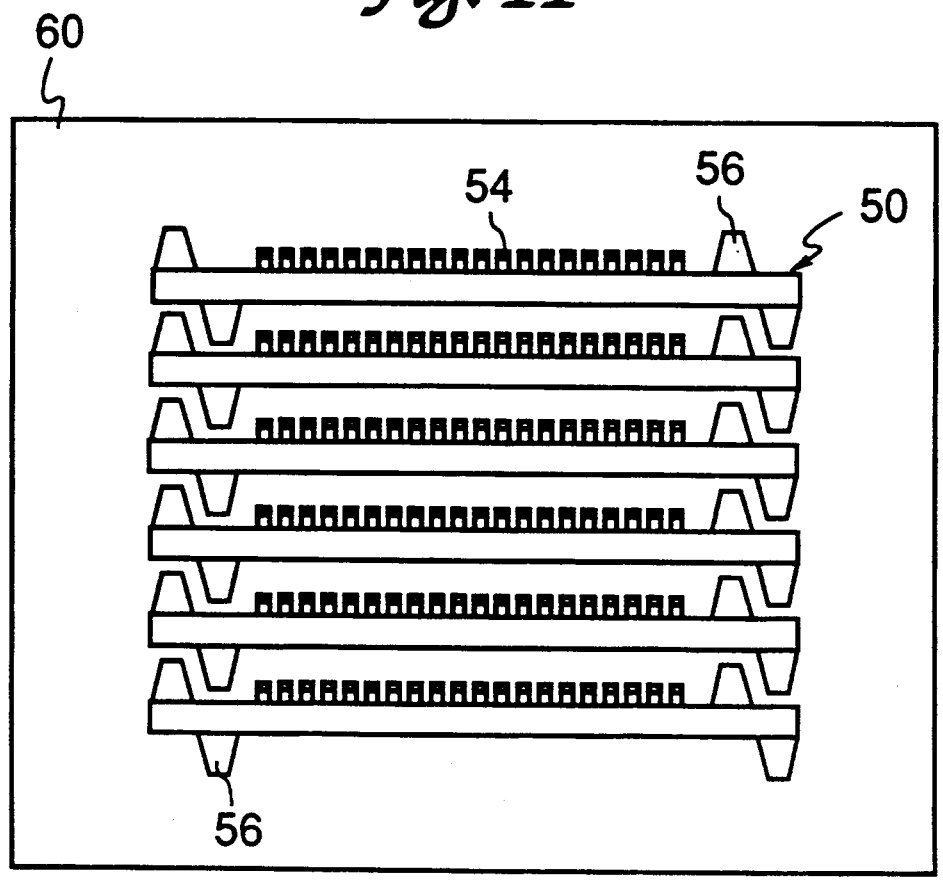
FIG. 11 is a plan view of a module on which packages of FIG. 7 are mounted.

A VSMP semiconductor package 30 having a package body 32 with first and second faces thereof for protecting a semiconductor chip is formed of EMC by a conventional heating method. Metal leads 34 protrude down from a lower side of the package body 32 and are bent in a horizontal direction, as seen in FIG. 6. Support portions 36 are formed on the first and second faces of the chip package body 32 at both ends of the side of the package body 32 from which leads 34 extend, as seen in FIGS. 6 and 8. Also, the support portions 36 are made of the same material as the package body 32 (i.e., EMC), and are formed along with the package body 32 during a press-molding process. As shown in FIG. 9, a first pair of support portions 36a disposed on the first face of the package body 32 is staggered to one side of the second pair of support portions 36b on the second face of package body 32. The support portions 36 extend outwardly from the package body 32 by a predetermined distance B, shown in FIG. 9. The support portions 36 of the package body 32 are formed to allow adjacent package bodies to be mounted on PCB 40 closely together to increase packing density, as illustrated in FIG. 11.

In addition, slot 38 is formed in the package body 32 between the support portions 36 to further protect the leads 34. The depth A of the slot 38 is equal to or larger than the length of the vertical segment of the bent leads 34.

The support portions 36 may be formed with an arbitrary shape but the bottom of each support portion 36 is flattened so that it can be adhered to the PCB by solder or a bonding agent, together with the leads 34.

A gap may occur between a lower part of the support portions 36 and the package body 32 due to a slow slope caused by taking a frame out after molding. In order to prevent such a gap from occurring, a conventional molding method may be used for taking a frame out in vertical direction with the lower part of the support portions 36. However, it is preferable to use a molding method for directly taking a frame out at the lower part of the support portions 36, so as to make the lower part of the support portions 36 even more flat.

Figure 10:
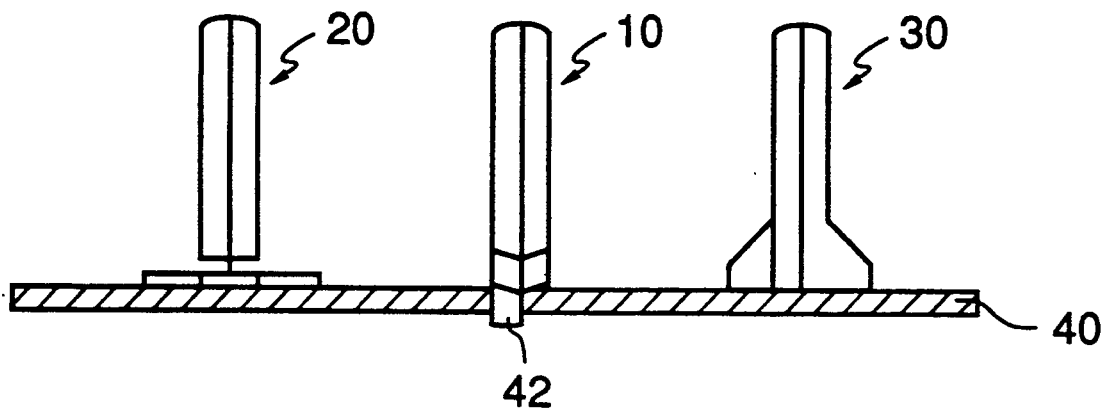
FIG. 10 is a side view of a printed circuit board on which the packages of FIG. 1, FIG. 3, and FIG. 6 are mounted.

As seen in FIG. 9, the horizontal length B of the support portions 36 is longer than or approximately equal to the horizontal extent of bent leads 34. Thus, the leads 34 are protected by the slot 38 and the horizontal extension of support portions 36 from deformation and damage by external force. Moreover, the support portions 36 permit the packages 30 to be firmly mounted on the PCB 40 as shown in FIG. 10.

FIG. 11 is a plan view of a module mounted with several semiconductor packages 50 of the type in FIG. 6.

A plurality of VSMP's 50 are vertically mounted on the PCB 60, and leads 54 and support portions 56 are adhered to the PCB 60. The support portions 56 are formed so as to conform closely with each other, as described above. Thus, the semiconductor packages 50 are mounted close to each other, thereby occupying a small area on the PCB 60 and improving the packing density.

As described above, according to the present invention, leads protrude from one side of a semiconductor chip package body. Support portions are formed to either side of the leads to permit mounting of the semiconductor chip package. The support portions may be made of the same material as the package body. Also, a slot is formed in the chip package to further protect the leads.

Thus, there are no additional process steps, such as forming holes in the PCB to mount the support portions of the semiconductor package, so the mounting process of the package becomes simpler. The support portions protruding from the package body are used to mount the package on the PCB firmly. The slot and support portions of the semiconductor chip package body help to prevent the leads from being deformed or damaged by external forces, thereby improving the reliability of the semiconductor package. Also, since the leads are formed in turn and the packages can be mounted near to each other, only a small area of the PCB is occupied, thereby improving the packing density.

What is claimed is:

1. A vertically mounted semiconductor chip package comprising:
    (a) a body having first and second substantially parallel planar faces and a perimeter edge extending between first and second corners along which leads extend;
    (b) first and second supports formed on the first face near the edge, the first support near the first corner and the second support near the second corner; and
    (c) third and fourth supports formed on said second face near the edge, the third support near the first corner and the fourth support near the second corner, wherein the first support is staggered along the edge from the third support and the second support is staggered along the edge from the fourth support.

2. A semiconductor chip package according to claim 1, wherein said first and second supports extend outwardly from the plane of the first face at least as far as the leads extend outwardly from the plane of the first face.

3. A semiconductor chip package according to claim 1, wherein said third and fourth supports extend outwardly from the plane of the second face at least as far as the leads extend outwardly from the plane of the second face.

4. A semiconductor chip package according to claim 1, wherein the body further includes a slot along the edge into which the leads protrude.

5. A package according to claim 4 wherein the extent of protrusion of the leads from the body along a direction parallel to the plane of the faces is less than or equal to the depth of the slot.

6. An electronic assembly comprising:
    a semiconductor chip mounted in a vertically mounted semiconductor chip package mechanically mounted to a printed circuit board and electrically connected to electrical connection lines on the printed circuit board, said vertically mounted semiconductor chip package comprising:
    (a) a body having first and second substantially parallel planar faces and a perimeter edge extending between first and second corners along which leads extend;
    (b) first and second supports formed on the first face near the edge, the first support near the first corner and the second support near the second corner; and (c) third and fourth supports formed on said second face near the edge, the third support near the first corner and the fourth support near the second corner, wherein the first support is staggered along the edge from the third support and the second support is staggered along the edge from the fourth support.

7. A semiconductor chip package comprising:

a generally rectangular body having a generally rectangular first face, a generally rectangular second face parallel to the first face and substantially the same length and width as the first face, and a first edge between first and second corners of the first and second face;

electrically conductive leads extending from the first edge;

a first support on the first face near the first corner;

a second support on the second face near the first corner and displaced along the edge from the first support;

a third support on the first face near the second corner;

a fourth support on the second face near the second corner and displaced along the edge from the third support, thereby forming a first pair of supports on the first face and a staggered pair of supports on the second face.

8. The package of claim 7 wherein:

the first edge includes a slot extending along a substantial length of the first edge, the leads extend away from the body in a direction parallel to the faces by an amount less then or equal to the depth of the slot; and the leads extend away from the body in a direction normal to the faces by an amount less than or equal to the extent of the supports.

* * * * *